(12) United States Patent
Simsek-Ege et al.

(10) Patent No.: US 8,507,387 B2
(45) Date of Patent: Aug. 13, 2013

(54) METHODS OF REMOVING NOBLE METAL-CONTAINING NANOPARTICLES

(75) Inventors: Fatma Arzum Simsek-Ege, Boise, ID (US); Brian Dolan, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/470,911

(22) Filed: May 14, 2012

(65) Prior Publication Data
US 2012/0225562 A1 Sep. 6, 2012

Related U.S. Application Data

(62) Division of application No. 12/467,718, filed on May 18, 2009, now Pat. No. 8,242,008.

(51) Int. Cl.
*H01L 21/306* (2006.01)
(52) U.S. Cl.
USPC ............ 438/748; 438/585; 257/E21.228
(58) Field of Classification Search
USPC .......... 257/324, 316, 298, E21.409, E21.294
See application file for complete search history.

(56) References Cited

U.S. PATENT DOCUMENTS

| | | | |
|---|---|---|---|
| 7,476,588 B2 | 1/2009 | Keller et al. | |
| 7,670,905 B2 | 3/2010 | Kiehlbauch | |
| 2007/0052011 A1 | 3/2007 | Bhattacharyya | |
| 2008/0041725 A1* | 2/2008 | Klein et al. | 204/640 |
| 2008/0142846 A1* | 6/2008 | Kim et al. | 257/200 |
| 2009/0097320 A1 | 4/2009 | Min et al. | |
| 2009/0134444 A1 | 5/2009 | Hanafi | |
| 2009/0155967 A1 | 6/2009 | Purayath et al. | |
| 2009/0302365 A1 | 12/2009 | Bhattacharyya | |
| 2009/0325373 A1 | 12/2009 | Sugizaki | |

* cited by examiner

*Primary Examiner* — Mamadou Diallo
(74) *Attorney, Agent, or Firm* — Wells St. John P.S.

(57) ABSTRACT

Some embodiments include methods of removing noble metal-containing particles from over a substrate. The substrate is exposed to a composition that reduces adhesion between the noble metal-containing particles and the substrate, and simultaneously the substrate is spun to sweep at least some of the noble metal-containing particles off from the substrate. Some embodiments include methods in which tunnel dielectric material is formed across a semiconductor wafer. Metallic nanoparticles are formed across the tunnel dielectric material. A stack of two or more different materials is formed over the metallic nanoparticles. A portion of the stack is covered with a protective mask while another portion of the stack is left unprotected. The unprotected portion of the stack is removed to expose some of the metallic nanoparticles. The semiconductor wafer to is subjected to etchant suitable to undercut at least some of the exposed metallic nanoparticles, and simultaneously the semiconductor wafer is spun.

8 Claims, 7 Drawing Sheets

US 8,507,387 B2

METHODS OF REMOVING NOBLE METAL-CONTAINING NANOPARTICLES

RELATED PATENT DATA

This patent resulted from a divisional of U.S. patent application Ser. No. 12/467,718, which was filed May 18, 2009, and which is hereby incorporated herein by reference.

TECHNICAL FIELD

Methods of removing noble metal-containing nanoparticles, methods of forming memory cells, and methods of forming integrated circuitry.

BACKGROUND

Noble metals are resistant to corrosion and oxidation; and include ruthenium, rhodium, palladium, silver, osmium, iridium, platinum and gold. The electrical, chemical and physical properties of noble metals may make them particularly well-suited for some applications in integrated circuit fabrication. For instance, nanoclusters of noble metals may be well-suited for utilization as charge-trapping centers of non-volatile memory cells.

A problem in utilizing noble metals is that their resistance to corrosion and oxidation may render it difficult to pattern and otherwise fabricate the metals utilizing conventional methodologies. For instance, a chemical commonly utilized for etching noble metals is aqua regia—which is a highly corrosive mixture of nitric acid and HCl. Unfortunately, aqua regia will attack numerous compositions associated with integrated circuitry, and thus it may not be suitable to utilize aqua regia during integrated circuit fabrication.

It would be desirable to develop new methods for patterning noble metals during integrated circuit fabrication.

DETAILED DESCRIPTION OF THE ILLUSTRATED EMBODIMENTS

Figure 1:
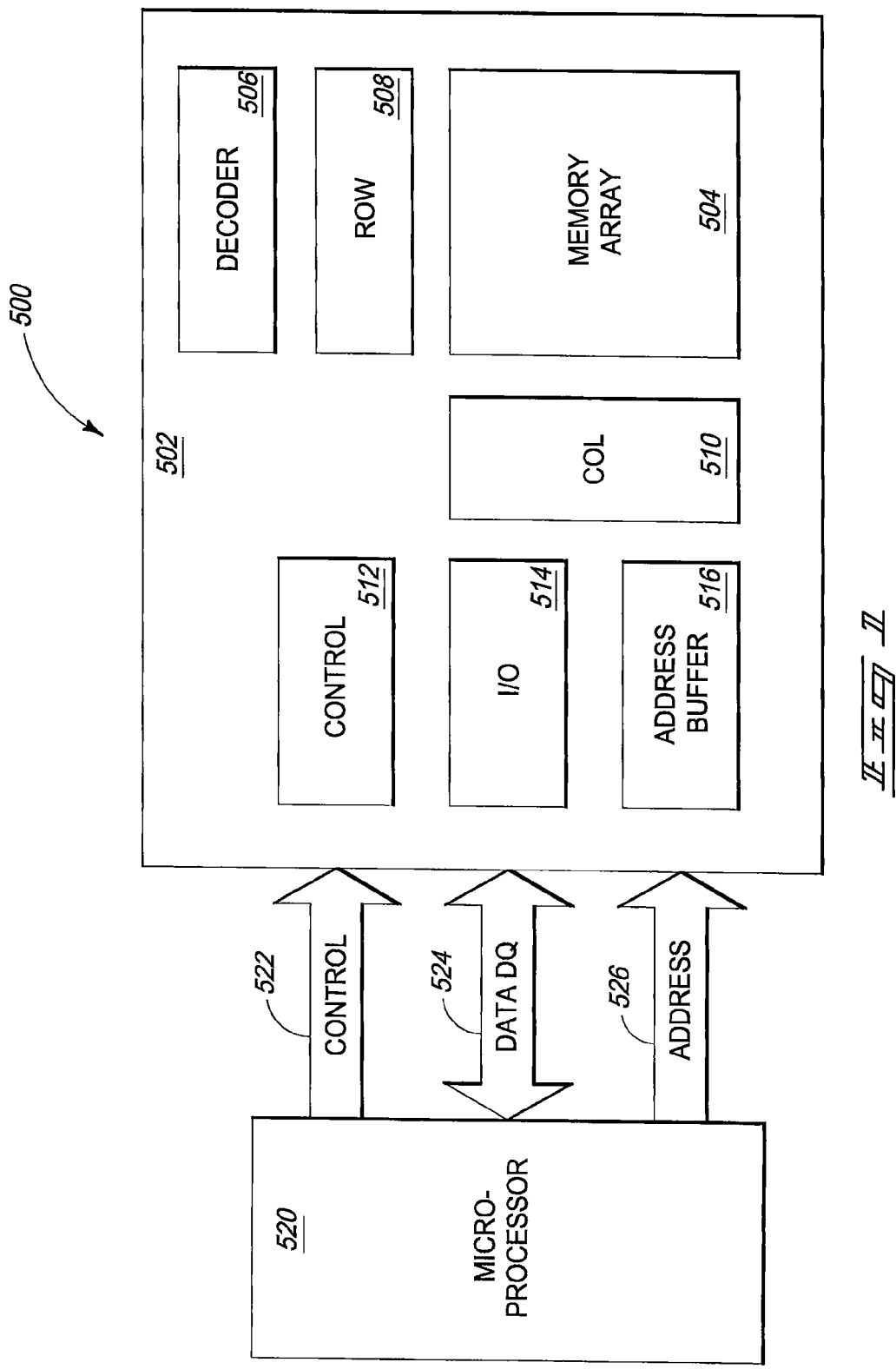
FIG. 1 is a simplified block diagram of a memory system in accordance with an embodiment.
Figure 2:
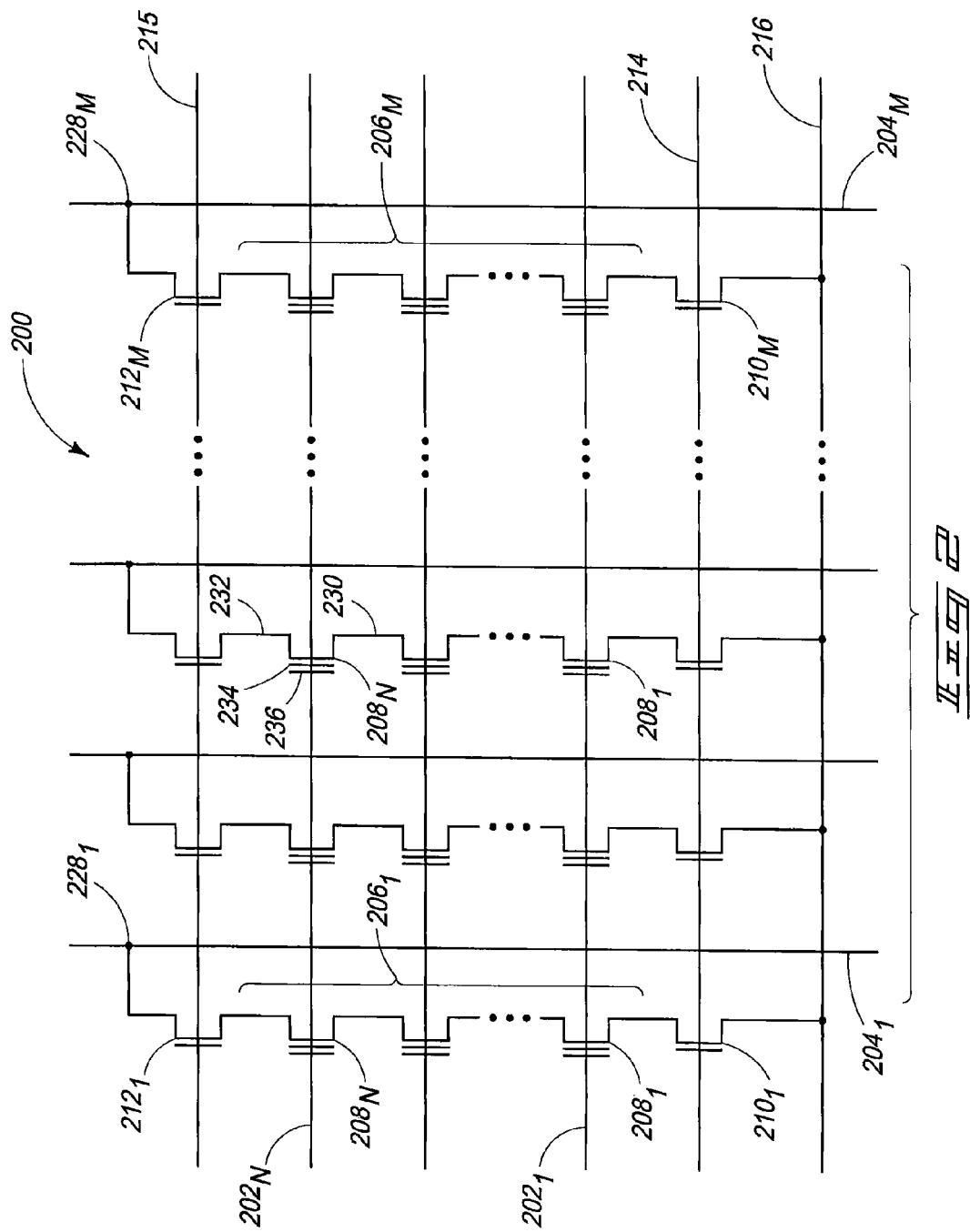
FIG. 2 is a schematic of a NAND memory array in accordance with an embodiment.

Some embodiments pertain to fabrication of structures associated with NAND. FIGS. 1 and 2 illustrate example NAND memory systems.

FIG. 1 is a simplified block diagram of a memory system 500. The memory system includes an integrated circuit flash memory device 502 (e.g., a NAND memory device), that includes an array of memory cells 504, an address decoder 506, row access circuitry 508, column access circuitry 510, control circuitry 512, input/output (I/O) circuitry 514, and an address buffer 516. Memory system 500 also includes an external microprocessor 520, or other memory controller, electrically connected to memory device 502 for memory accessing as part of an electronic system. The memory device 502 receives control signals from the processor 520 over a control link 522. The memory cells are used to store data that is accessed via a data (DQ) link 524. Address signals are received via an address link 526, and are decoded at address decoder 506 to access the memory array 504. Address buffer circuit 516 latches the address signals. The memory cells may be accessed in response to the control signals and the address signals.

FIG. 2 is a schematic of a NAND memory array 200. Such may be a portion of memory array 504 of FIG. 1. Memory array 200 includes wordlines $202_1$ to $202_N$, and intersecting local bitlines $204_1$ to $204_M$. The number of wordlines 202 and the number of bitlines 204 may be each some power of two, for example, 256 wordlines and 4,096 bitlines. The local bitlines 204 may be coupled to global bitlines (not shown) in a many-to-one relationship.

Memory array 200 includes NAND strings $206_1$ to $206_M$. Each NAND string includes charge-storage transistors $208_1$ to $208_N$. The charge-storage transistors may use floating gate material to store charge, or may use charge-trapping material (such as, for example, metallic nanodots) to store charge.

The charge-storage transistors 208 are located at intersections of wordlines 202 and local bitlines 204. The charge-storage transistors 208 represent non-volatile memory cells for storage of data. The charge-storage transistors 208 of each NAND string 206 are connected in series source to drain between a source select gate 210 and a drain select gate 212. Each source select gate 210 is located at an intersection of a local bitline 204 and a source select line 214, while each drain select gate 212 is located at an intersection of a local bitline 204 and a drain select line 215.

A source of each source select gate 210 is connected to a common source line 216. The drain of each source select gate 210 is connected to the source of the first charge-storage transistor 208 of the corresponding NAND string 206. For example, the drain of source select gate $210_1$ is connected to the source of charge-storage transistor $208_1$ of the corresponding NAND string $206_1$. The source select gates 210 are connected to source select line 214.

The drain of each drain select gate 212 is connected to a local bitline 204 for the corresponding NAND string at a drain contact 228. For example, the drain of drain select gate $212_1$ is connected to the local bitline $204_1$ for the corresponding NAND string $206_1$ at drain contact $228_1$. The source of each drain select gate 212 is connected to the drain of the last charge-storage transistor 208 of the corresponding NAND string 206. For example, the source of drain select gate $212_1$ is connected to the drain of charge-storage transistor $208_N$ of the corresponding NAND string $206_1$.

Charge-storage transistors 208 include a source 230, a drain 232, a charge storage region 234, and a control gate 236.

Charge-storage transistors 208 have their control gates 236 coupled to a wordline 202. A column of the charge-storage transistors 208 are those transistors within a NAND string 206 coupled to a given local bitline 204. A row of the charge-storage transistors 208 are those transistors commonly coupled to a given wordline 202.

Some embodiments include methods of removing noble metals from an underlying substrate. Such methods may comprise exposing the noble metals and the substrate to a composition that reduces adhesion between the noble metals and the substrate, coupled with the application of forces on the metals suitable to sweep the noble metals off from the substrate. In some embodiments, the composition utilized to reduce adhesion between the noble metals and the substrate may include an etchant that etches into the substrate to undercut the metals. In some embodiments, the composition utilized to reduce adhesion between the noble metals and the substrate may include one or more chemicals that alter surface properties of the noble metals (for instance, such chemicals may oxidize surfaces of noble metals, may convert surfaces of the noble metals to metallorganics, etc.). In some embodiments, the composition that reduces adhesion between the noble metals and the substrate may both alter surface properties of the noble metals and etch into the substrate to undercut the noble metals.

Some embodiments avoid the problems associated with conventional approaches of trying to etch the noble metal by instead altering surfaces properties of the noble metals, and/or etching a substrate under the noble metals to undercut the noble metals. The chemicals utilized to alter the surface properties of the noble metals may be similar to chemicals utilized in conventional etching of noble metal, but may be used under milder conditions than a conventional etch. Specifically, since the chemicals are being utilized to alter surface properties of the noble metals, rather than to entirely remove the noble metals, the chemicals may have less aggressive chemistry, and/or be used at lower concentrations, temperatures and/or treatment times, than would be used for a conventional etch of noble metals.

A noble metal-containing particle will often be retained to an underlying substrate through interactions between the surface of the particle and a surface of the substrate. In some embodiments, the adhesion between noble metal-containing particles and an underlying substrate is reduced by reducing the amount of contact between surfaces of the noble metal-containing particles and a surface of the substrate, and/or by chemically altering surfaces of one or both of the noble metal-containing particles and the substrate. Once such adhesion is reduced, the particles can be swept off from the substrate by applying a force to the particles; such as by flowing liquid over the particles while spinning the underlying substrate to create hydrodynamic and centrifugal forces which push the particles off from the substrate.

The specific embodiments described herein are shown in the context of application to fabrication of non-volatile memory. However, the methods described herein may be generally applicable to other semiconductor fabrication processes, and accordingly the claims that follow are not limited to non-volatile memory cell fabrication processes except to the extent that the claims expressly recite non-volatile memory cell fabrication sequences.

Example embodiments are described with reference to FIGS. 3-10.

Figure 3:
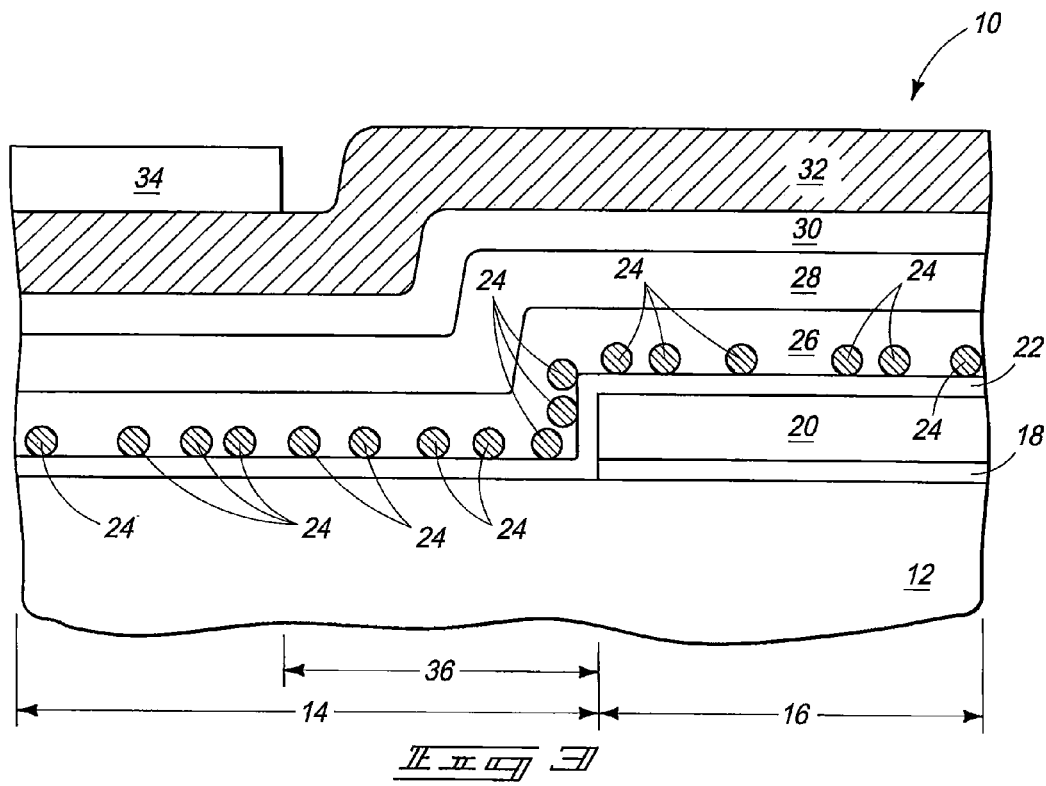
FIG. 3 is a diagrammatic, cross-sectional view of a portion of a semiconductor wafer fragment at a processing stage of an example embodiment. The wafer fragment includes a memory array region, and a peripheral region adjacent to the memory array region.

Referring to FIG. 3, such illustrates a portion of a semiconductor construction 10. The semiconductor construction 10 includes a semiconductor wafer substrate 12. Substrate 12 can comprise, consist essentially of or consist of for example, monocrystalline silicon lightly-doped with background p-type dopant. The terms "semiconductive substrate" and "semiconductor substrate" mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" means any supporting structure, including, but not limited to, the semiconductive substrates described above.

The construction 10 is divided into a memory array region 14 and a peripheral region 16 adjacent the memory array region. In the shown embodiment, the memory array region will be utilized for fabrication of non-volatile memory cells. The peripheral region may be utilized for fabrication of logic and/or other peripheral circuitry associated with reading and/or writing relative to non-volatile memory.

In the shown embodiment, the peripheral region is covered by an electrically insulative material 18 and an overlying material 20. The insulative material 18 may be a tunnel dielectric material, such as, for example, silicon dioxide and/or any of various metal oxides. The overlying material 20 may comprise, consist essentially of or consist of silicon; and in some embodiments may be polycrystalline silicon. The silicon of material 20 may be conductively-doped in some applications, and in other applications may not be conductively-doped at the processing stage of FIG. 3. Although the materials 18 and 20 over the peripheral region are shown as layers, rather than being shown as specific integrated circuit structures (for instance, transistors, metal lines, insulative barriers, etc.), in other embodiments there may be one or more integrated circuit structures fabricated over the peripheral region at the processing stage of FIG. 3. Regardless of whether or not integrated circuit structures have been fabricated over the peripheral region, there may be some type of protective cap formed over the peripheral region at the processing stage of FIG. 3, and material 20 may be considered to be representative of such protective cap.

After materials 18 and 20 have been formed over the peripheral region, a series of materials associated with memory cell fabrication are formed over the memory array region, and are formed across the protective material 20 of the peripheral region. In the shown embodiment, the materials associated with memory cell fabrication include a tunnel dielectric material 22, a plurality of metallic nanoparticles 24, a dielectric material 26 over and between the nanoparticles, another dielectric material 28 over material 26, yet another dielectric material 30 over the material 28, and an electrically conductive control gate material 32. FIG. 3 is a diagrammatic representation of the shown structure, and the various materials of FIG. 3 are not drawn to scale.

The tunnel dielectric material 22 extends along the semiconductor wafer substrate 12 of the memory array region 14, and extends over material 20 of the peripheral region 16. In some embodiments, the surface of substrate 12 along the memory array region may be a surface of a monocrystalline silicon wafer, and accordingly tunnel dielectric 22 may be directly against (i.e., physically touching) semiconductor material of a semiconductor wafer (for instance, monocrystalline silicon of a monocrystalline silicon wafer). In some embodiments, material 20 may be referred to as a "first material" to distinguish such material from other materials subsequently formed over material 20; such as, for example, the other illustrated materials associated with memory cell fabrication.

The tunnel dielectric material may comprise any suitable composition or combination of compositions, and in some embodiments may comprise, consist essentially of, or consist of silicon dioxide and/or various metal oxides (for instance, aluminum oxide, hafnium oxide, etc.). The tunnel dielectric material may be formed by any suitable method, and in some embodiments the tunnel dielectric material may correspond to silicon dioxide formed by in situ steam generation and corresponding oxidation of monocrystalline silicon along a surface of substrate 12. The tunnel dielectric material may have any suitable thickness, and in some embodiments may have a thickness of about 60 angstroms.

The metallic nanoparticles 24 are directly against (i.e. physically touching) tunnel dielectric material 22. The metallic nanoparticles may comprise, consist essentially of, or consist of one or more noble metals. For instance, in some embodiments the metallic nanoparticles may comprise, consist essentially of, or consist of one or more of palladium, platinum, rhodium, iridium and ruthenium. The metallic nanoparticles may have any suitable size and configuration. For instance, in some embodiments the nanoparticles may be substantially spherical with diameters of from about 1 nanometer to about 20 nanometers; and in some embodiments may have diameters of about 5 nanometers. In some embodiments, the individual nanoparticles may be single grains of metallic material, or may be clusters of metallic material; and may be formed utilizing conventional methods. Ultimately, some of the metallic nanoparticles within the memory array region will be incorporated into charge storage regions. The remaining nanoparticles are excess nanoparticles which are to be subsequently removed with further processing (as discussed below with reference to FIGS. 4-7 and 9).

Dielectric material 26 may comprise any suitable composition or combination of compositions; and in some embodiments may comprise, consist essentially of, or consist of hafnium oxide. Dielectric material 26 may be formed by any suitable methodology, such as, for example, or both of atomic layer deposition (ALD) and chemical vapor deposition (CVD), and may be formed to any suitable thickness. In some embodiments, material 26 may correspond to hafnium oxide formed to a thickness of from about 20 angstroms to about 100 angstroms; and may, for example, have a thickness of about 50 angstroms.

Dielectric materials 28 and 30 may comprise any suitable compositions or combinations of compositions. In some embodiments material 28 may comprise, consist essentially of, or consist of aluminum oxide; and material 30 may comprise, consist essentially of, or consist of silicon oxide. Materials 28 and 30 may be formed by any suitable processing, including, for example, one or both of ALD and CVD; and may be formed to any suitable thicknesses. In some embodiments, material 28 may correspond to aluminum oxide formed to a thickness of about 150 angstroms, and material 30 may correspond to silicon dioxide formed from tetraethyl orthosilicate (TeOS) to a thickness of about 50 angstroms.

Control gate material 32 may comprise any suitable composition or combination of compositions. The control gate material is electrically conductive, and in some embodiments may comprise, consist essentially of, or consist of any of various metals, metal-containing compositions, and/or conductively-doped semiconductive material (for instance, conductively-doped polycrystalline silicon). Control gate material 32 may be formed by any suitable method, including, for example, one or more of ALD, CVD and physical vapor deposition (PVD). In some embodiments, control gate material 32 may correspond to conductively-doped polycrystalline silicon formed to a thickness of about 300 angstroms.

Although material 32 is described as an electrically conductive control gate material, in other embodiments material 32 may be a sacrificial material. For instance, material 32 may be a polysilicon layer utilized as an etch stop in subsequent processing (not shown). If material 32 is sacrificial, it may be electrically conductive, electrically insulative, or semiconductive.

The materials 26, 28, 30 and 32 together form a stack over metallic nanoparticles 24. Although the shown stack has three insulative materials and a conductive material, in other embodiments the stack may comprise other combinations of materials.

A masking material 34 is over a portion of the stack across memory array region 14, and not across the peripheral region 16. The masking material 34 forms a protective mask across a section of the memory array region, while leaving the peripheral region unprotected. In the shown embodiment, the mask 34 only protects part of the memory array region, and leaves another part 36 of the memory array region unprotected. Persons of ordinary skill in the art will recognize that the terms "memory array region" and "peripheral region" refer to general areas of a semiconductor wafer, and may not have clearly demarcated boundaries relative to one another. Thus, the portion 36 that is described as being a part of the memory array region not covered by protective mask 34 may alternatively be considered to be part of the peripheral region, or may alternatively be considered to be part of a transition area between the memory array region and the peripheral region. In some embodiments, portion 36 may be described by a first describing the area where tunnel dielectric 22 contacts semiconductor substrate 12 as being a first region, and than describing portion 36 as corresponding to a segment of such first region which is not protected by masking material 34.

Figure 4:
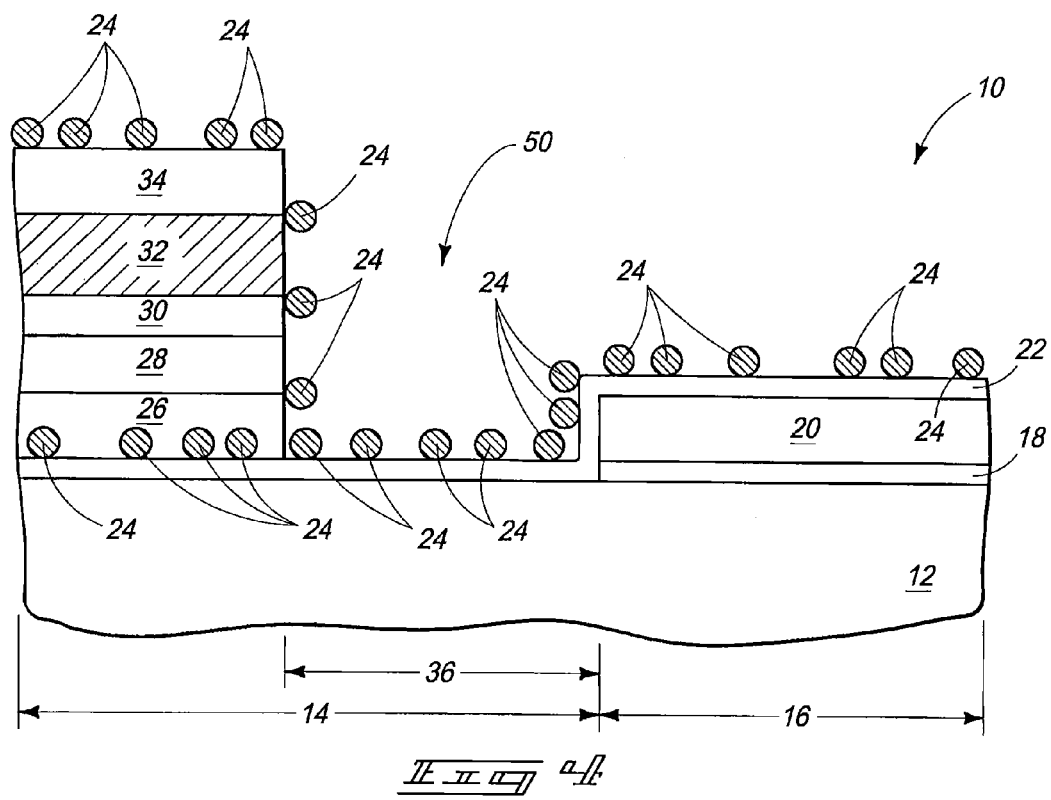
FIG. 4 is a view of the FIG. 3 wafer fragment shown at a processing stage subsequent to that of FIG. 3.

Referring to FIG. 4, one or more etches are utilized to remove portions of materials 26, 28, 30 and 32 that are not protected by masking material 24. Such patterns materials 26, 28, 30 and 32 over memory array region 14. The etching of materials 26, 28, 30 and 32 may utilize conventional methods and chemistries. In some embodiments, the final etch may be a dry etch which stops on metallic nanoparticles 24 and the underlying tunnel dielectric 22.

A problem that occurs during the etching of materials 26, 28, 30 and 32 is that the excess metallic nanoparticles 24 redistribute across numerous exposed surfaces of construction 10, and specifically are shown to redistribute so that some of the nanoparticles are along surfaces of masking material 34. The various materials under the exposed nanoparticles may be collectively referred to as a base that supports the nanoparticles.

The shown embodiment forms an opening 50 adjacent peripheral region 16 to expose a segment of tunnel dielectric material 22 within the portion 36 of memory region 14 that had not been protected by protective material 34. Some of the excess nanoparticles 24 are illustrated to be within the opening. In the illustrated embodiment, some of the excess nanoparticles are also adhered to vertical surfaces within opening 50. In some embodiments, the nanoparticles would not adhere to such vertical surfaces, while in other embodiments they would, depending on the surface properties of the nanoparticles and the materials along the vertical surfaces of opening 50.

Numerous difficulties may be encountered in attempting to remove the excess nanoparticles 24 from across peripheral region 16, within opening 50, and across masking material 34, if conventional methodologies are utilized. In some embodiments, new methods are utilized for removing the excess nanoparticles. The new methods may comprise exposing the nanoparticles, and the materials under the nanoparticles, to a composition that reduces adhesion between the nanoparticles and the underlying materials, while simultaneously spinning the substrate to induce forces on the nanoparticles which sweep the nanoparticles off from the substrate. The composition may alter surface properties of the nanoparticles and/or the underlying materials (for instance, the composition may include a strong oxidant, like peroxide or any of various acids, that oxidizes the surfaces of the nanoparticle; and if oxidants are utilized, appropriate low pH may be utilized for the oxidants to have appropriate electrochemical potential for oxidation to occur). Additionally, or alternatively, the composition may include etchant suitable to etch materials under the nanoparticles to thereby undercut the nanoparticles and reduce adhesion between the nanoparticles and the underlying materials.

Figure 5:
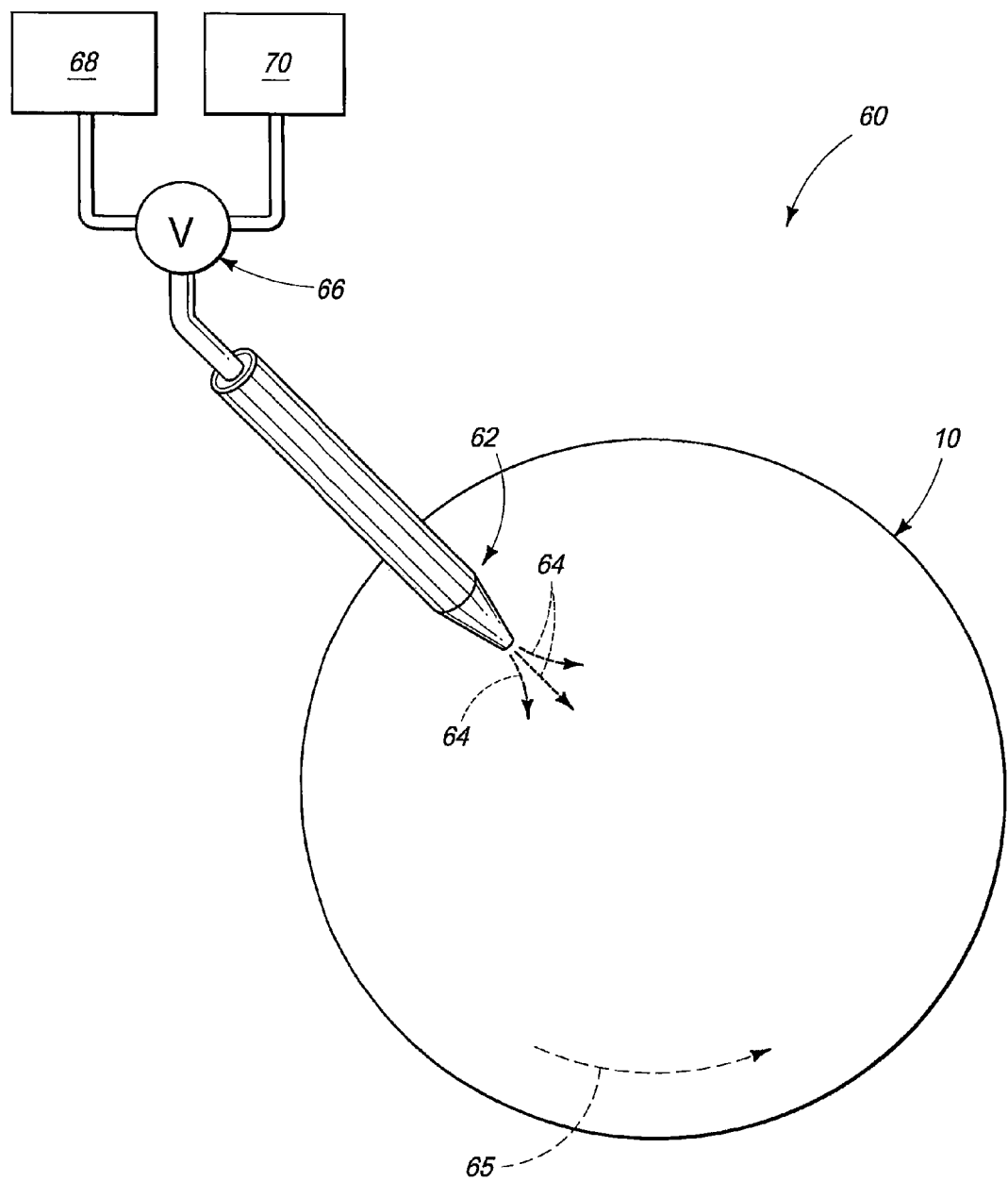
FIG. 5 is a diagrammatic view of a system that may be used for treating a semiconductor wafer in accordance with an example embodiment.

FIG. 5 illustrates an example system 60 that may be utilized to provide a composition suitable for reducing adhesion between nanoparticles and underlying materials, while simultaneously spinning a semiconductor wafer substrate. The system is shown to comprise a nozzle 62 oriented to direct a stream of fluid 64 toward a semiconductor wafer construction 10. An arrow 65 illustrates that the semiconductor construction 10 is spun while the fluid 64 is directed thereon. The semiconductor construction may be retained within a chuck or other structure (not shown) connected to a motor and configured for spinning the wafer. The tool utilized for spinning the wafer may be a conventional tool.

Nozzle 62 is shown to be in fluid connection with a valve 66, which in turn is in fluid connection with a pair of reservoirs 68 and 70. In operation, one of the reservoirs may contain the composition which reduces adhesion between the nanoparticles and the underlying materials, and the other may contain a rinsing solution (for instance, deionized water). The composition that reduces adhesion between the nanoparticles and the underlying materials may be referred to as a "treatment composition". In operation, valve 66 may be in an initial orientation so that the treatment composition is flowed through nozzle 62 and onto the spinning wafer for an initial duration, and then the valve may be rotated so that the rinse solution is then flowed through nozzle 62 and onto the spinning wafer to rinse the treatment composition from the wafer. In some embodiments, the system of FIG. 5 enables the treatment composition and the rinse solution to be sequentially flowed through the same nozzle and directed toward the spinning wafer.

Although only two reservoirs are shown in the illustrated embodiment, in other embodiments there may be multiple different reservoirs in fluid connection with the nozzle so that multiple different treatment compositions and/or rinse solutions may be sequentially directed onto the spinning wafer. Also, although only one nozzle is shown, in other embodiments multiple nozzles may be utilized. If multiple nozzles are utilized, the treatment composition may be passed through a different nozzle than the rinse solution.

The nozzle 62 may be stationary in some embodiments, and in other embodiments may be connected with one or more structures (not shown) configured to move the nozzle relative to the spinning wafer.

If etchant is utilized in the treatment composition, such etchant may be any etchant suitable for undercutting at least some of the noble metal-containing nanoparticles. For instance, if the nanoparticles are distributed across photoresist surfaces and oxide surfaces (for instance, silicon dioxide surfaces), the etchant may comprise hydrofluoric acid, fluorine-based derivatives, or a piranha solution (specifically, a mixture of sulfuric acid and hydrogen peroxide). In embodiments in which multiple etchants are utilized, the etchants may be selected to be appropriate to etch various surfaces that noble metal-containing particles are distributed over.

In some embodiments, the treatment composition may comprise both etchant and a chemical that alters surface properties of the nanoparticles. For instance, if the nanoparticles are across both silicon dioxide and photoresist, the treatment composition may comprise an oxidant suitable to both remove the photoresist, and to oxidize exposed surfaces of the nanoparticles. Such oxidant may have little effect on the silicon dioxide, and thus may reduce adhesion of the nanoparticles to the silicon dioxide and photoresist by two different mechanisms. Specifically, the adhesion to the photoresist may be reduced by oxidatively removing the photoresist to undercut the nanoparticles; and the adhesion to the silicon dioxide may be reduced primarily through oxidation of surfaces of the nanoparticles, rather than through removal of the silicon dioxide. Example oxidants are hydrogen peroxide, and one or more of acids of aqua regia. If an oxidant is utilized, appropriate low pH may be utilized for the oxidant to have an appropriate electrochemical potential for oxidation to occur.

Figure 6:
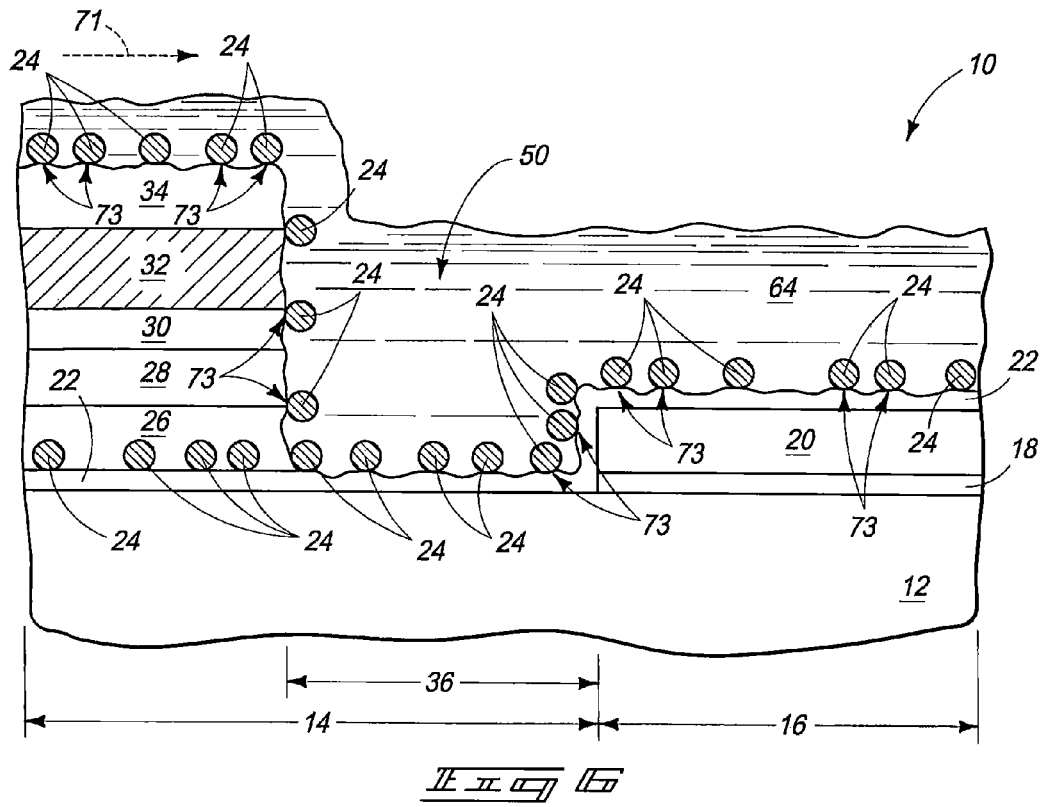
FIG. 6 is a view of the FIG. 3 wafer fragment shown at a processing stage subsequent to that of FIG. 4, and during treatment with a system of the type shown in FIG. 5.

FIG. 6 shows ridges created beneath the noble metal-containing particles 24 due to the etchant removing materials from under the particles. In other words, the etchant has partially undercut the noble metal-containing particles. Such has reduced the amount of surface area from the particles that directly contacts the material underlying the particles, and thus weakens adhesion between the particles and the underlying materials. After such adhesion is weakened, the particles may be swept off of the substrate due to the combination of hydrodynamic and centrifugal forces created by the fluid 64 and spinning of the semiconductor construction 10.

Semiconductor construction 10 may be spun at any appropriate speed during the processing of FIG. 5, and in some embodiments will be spun at a rate of from about 300 rotations per minute (RPM) to about 1000 RPM.

FIG. 6 shows construction 10 as it is exposed to fluid 64 directed onto the spinning construction, in an embodiment in which etchant is utilized to undercut the nanoparticles. The fluid has a direction of flow illustrated by arrow 71. The flowing fluid provides hydrodynamic forces against noble metal-containing particles 24, and simultaneously the spin of the wafer of construction 10 causes centrifugal forces against the particles.

Fluid 64 may be either etchant or rinse solution at the processing stage of FIG. 6. However, at some point the fluid comprised etchant solution, and such solution etched the various exposed surfaces of tunnel dielectric material 22 and masking material 34. In the shown embodiment, the etching solution has also etched surfaces of materials 28, 30 and 32; but such is optional in various embodiments.

If tunnel dielectric material 22 and masking material 34 consist of silicon dioxide and photoresist, respectively, the etchant solution may comprise hydrofluoric acid, or may be a piranha solution.

If the treatment composition comprises hydrofluoric acid, such may be formed by mixing deionized water with concentrated hydrofluoric acid (specifically, 49% hydrofluoric acid) in a volume ratio of from about 100:1 to about 500:1 (water: concentrated hydrofluoric acid). The hydrofluoric acid-containing treatment composition may be utilized for a duration of from about 15 seconds to about three minutes (with longer durations be utilized with lower concentrations of hydrofluoric acid), and at about room temperature (e.g., about 22° C.). Subsequently, a deionized water rinse may be conducted for a duration of at least about 30 seconds, and thereafter the wafer may be spun dry while exposed to nitrogen gas for a duration of at least about 30 seconds.

If the treatment composition is a piranha solution, such may be formed by mixing sulfuric acid (98 weight percent) with hydrogen peroxide (30 weight percent) in a volume ratio of from about 5:1 to about 12:1 (sulfuric acid:hydrogen peroxide). The treatment composition may be utilized for a duration of from about 15 seconds to about two minutes, at a temperature of about 100° C. to about 140° C. Subsequently, a deionized water rinse may be conducted for a duration of at least about 60 seconds, and thereafter the wafer may be spun dry while exposed to nitrogen gas for a duration of at least about 30 seconds. An advantage of utilizing piranha chemistry is that such may enable a resist strip to be accomplished simultaneously with the removal of the excess noble metal-containing particles.

It has been observed that application of fluid and spinning of a wafer with a conventional spin-clean technology will not remove noble metal-containing particles to the extent that may be achieved when utilizing an etchant suitable to etch the materials underlying the particles. Also, it has been observed that batch cleaning with static etchants (either etchants configured to remove materials from under the metal-containing nanoparticles, or etchants configured to remove the nanoparticles themselves) does not clean the noble metal-containing particles from the surfaces to the extent that may be achieved utilizing spinning in combination with etchant suitable to etch materials underlying the noble metal-containing nanoparticles. Thus, embodiments of the present invention that utilize an etchant suitable to remove materials underlying noble level-containing particles, in combination with spinning of a wafer, can result in better cleaning of the noble metal-containing particles from the wafer than can conventional cleaning technologies. This may be of significant advantage for semiconductor device fabrication, in that even minor contamination by excess noble metal-containing nanoparticles may result in device failure.

Figure 7:
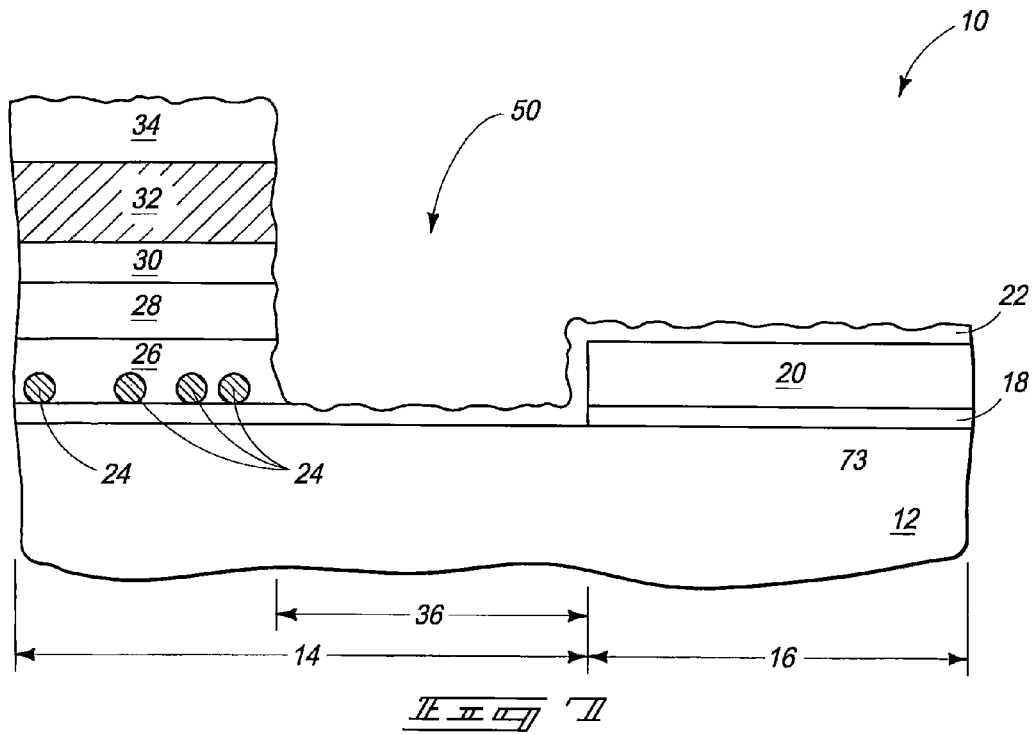
FIG. 7 is a view of the FIG. 3 wafer fragment shown at a processing stage subsequent to that of FIG. 6.

Referring next to FIG. 7, such shows construction 10 after utilization of fluid 64 (FIG. 6) to remove the excess noble metal-containing nanoparticles 24 from within opening 50, across an upper surface of material 34, and across an upper surface of material 22. The utilization of fluid 64 may remove substantially all of the noble metal-containing nanoparticles 24 from exposed surfaces of materials 34 and 22 of construction 10, and in some embodiments may remove all of the excess noble metal-containing nanoparticles from exposed surfaces of materials 34 and 22 (or at least may remove all detectable excess noble metal-containing nanoparticles from exposed surfaces of materials 34 and 22 of the substrate).

Figure 8:
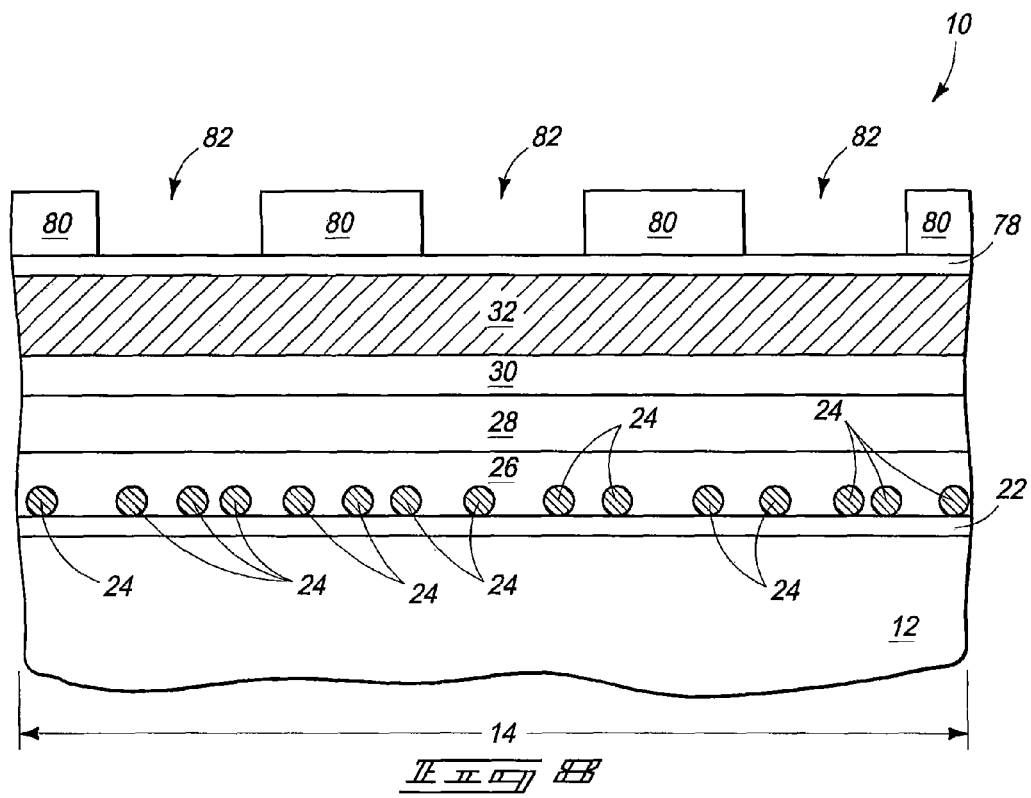
FIG. 8 is a view of the memory array region of the FIG. 3 wafer fragment shown at a processing stage subsequent to that of FIG. 7.
Figure 9:
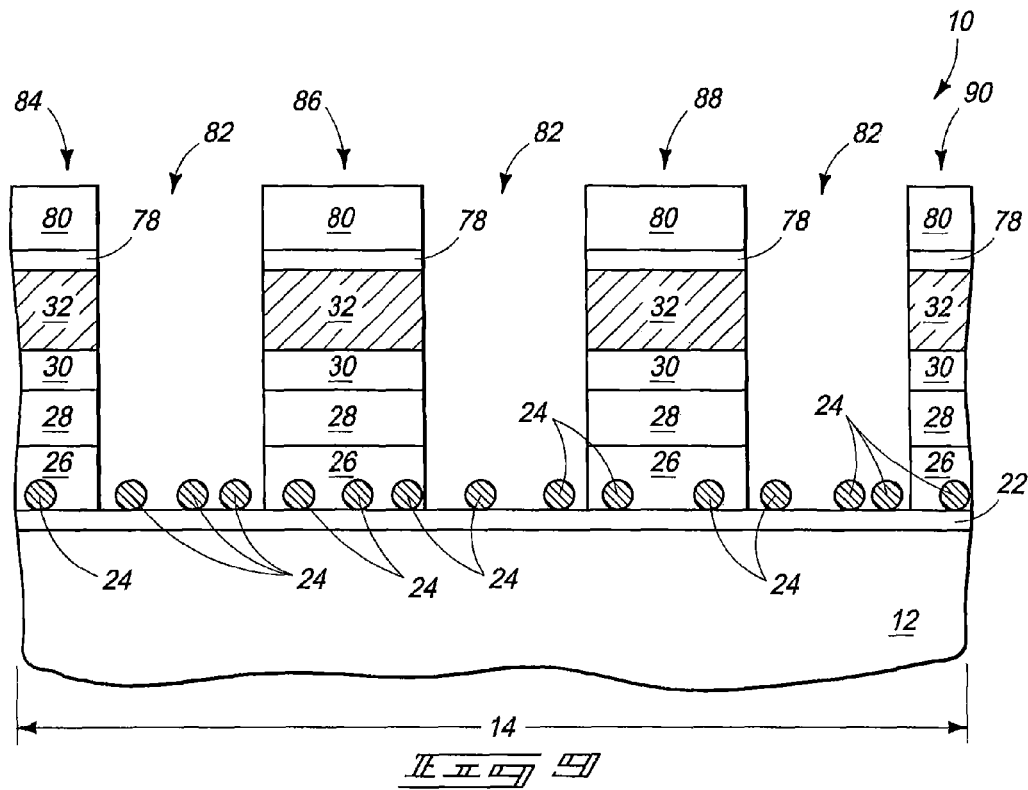
FIG. 9 is a view of the memory array region of FIG. 8 shown at a processing stage subsequent to that of FIG. 8.
Figure 10:
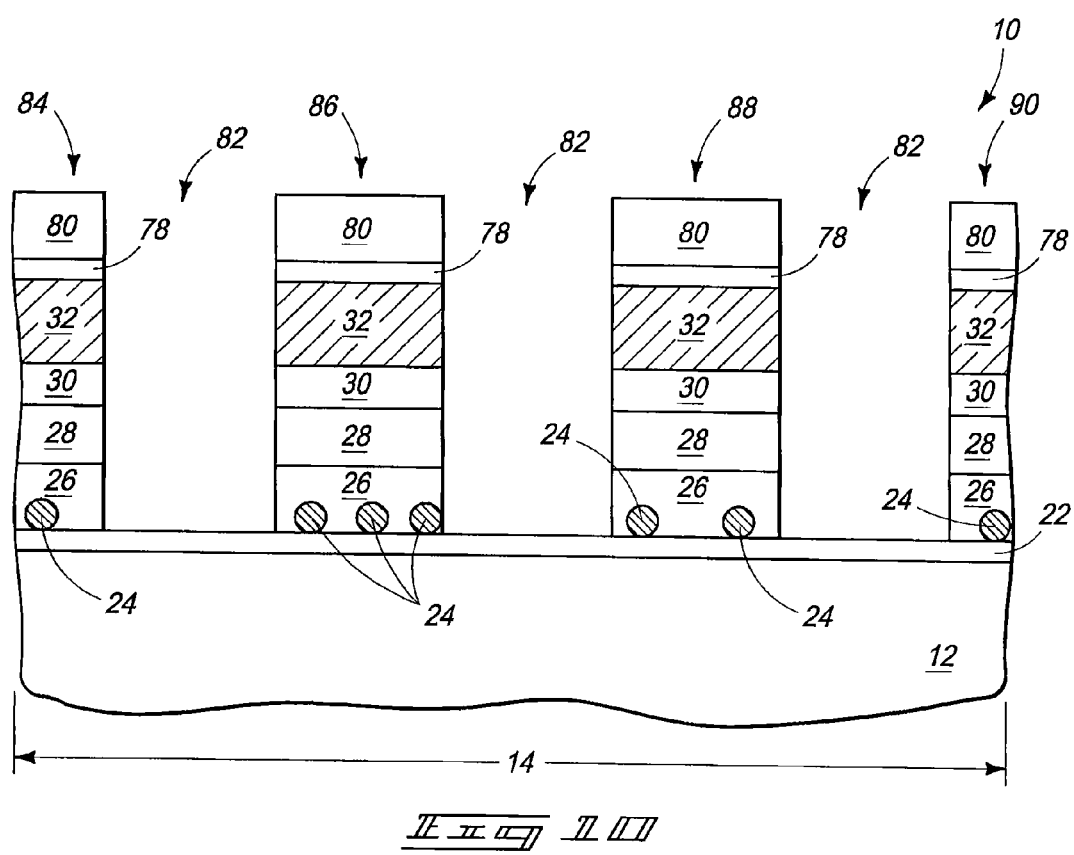
FIG. 10 is a view of the memory array region of FIG. 8 shown at a processing stage subsequent to that of FIG. 9.

The construction of FIG. 7 may be subsequently subjected to additional processing to form memory cells across the memory array region 14 and/or to form logic and other structures across peripheral region 16. FIGS. 8-10 illustrate processing which may be utilized to pattern memory cells across memory array region 14.

Referring to FIG. 8, such shows the memory array region 14 at a processing stage subsequent to that of FIG. 7. An electrically insulative capping material 78 is formed over control gate material 72, and a masking material 80 is formed over the capping material.

The insulative capping material may comprise any suitable composition or combination of compositions, and in some embodiments may comprise silicon nitride or silicon oxynitride.

The masking material 80 may comprise any suitable composition or combination of compositions, and in some embodiments may comprise carbon (for instance, amorphous carbon). If the masking material comprises amorphous carbon, such may be patterned in the shown configuration utilizing photolithographically patterned photoresist (not shown) to create a pattern which is transferred to material 80 with one or more suitable etches, followed by removal of the photoresist to leave the construction of FIG. 8. There may be other materials (not shown) between the masking material 80 and the capping material 78, such as, for example, a deposited antireflective coating (DARC).

Masking material 80 defines locations of memory cells, and has a plurality of openings 82 extending therethrough which define spaces that are to be formed between the memory cells.

Referring to FIG. 9, openings 82 are transferred through materials 26, 28, 30, 32 and 78 with one or more suitable etches. Such patterns materials 26, 28, 30, 32 and 78 into a plurality of memory cells 84, 86, 88 and 90, and exposes noble metal-containing nanoparticles 24 within spaces between the memory cells. The nanoparticles exposed within such spaces are excess nanoparticles that are to be removed from construction 10. Such removal may be accomplished utilizing processing of the type described above with reference to FIGS. 5-7. For instance, the removal of the nanoparticles may utilize a suitable etchant to undercut the excess nanoparticles (and/or may utilize a chemical suitable to alter surface properties of the nanoparticles), together with spinning of construction 10 to create forces on the nanoparticles that sweep the nanoparticles off from the construction.

Although FIG. 9 shows the excess nanoparticles confined within the spaces 82 between the memory cells, in some embodiments the excess nanoparticles may become distributed across numerous exposed surfaces analogous to the distribution shown in FIG. 4. In such embodiments, the removal of the excess nanoparticles may comprise utilization of a treatment composition of the type described above with reference to FIGS. 5 and 6 to remove the nanoparticles. In specific embodiments, such treatment composition may contain one or more chemicals that alter surface properties of the nanoparticles, and/or may contain one or more etchants suitable to undercut the nanoparticles.

FIG. 10 shows construction 10 at a processing stage after the excess nanoparticles have been removed from the construction to leave the plurality of memory cells 84, 86, 88 and 90 patterned across the memory array region 14. Although an upper surface of layer 22 appears to be smooth in the spaces between the memory cells, it may be etched and roughened relative to the processing stage of FIG. 9 due to etching utilized to undercut the excess nanoparticles that had been present at the processing stage of FIG. 9. In subsequent processing, the memory cells may be incorporated into a NAND memory array, such as, for example, NAND memory arrays of the types described in FIGS. 1 and 2.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. A method of removing noble metal-containing particles from over a base, comprising:

exposing the base and noble metal-containing particles to a composition that reduces adhesion between the noble metal-containing particles and the base;

while exposing to said composition, spinning the base to apply forces to the noble metal-containing particles and thereby sweep at least some of the noble metal-containing particles off from the base;

wherein the composition includes an etchant that etches the base and thereby undercuts the noble metal-containing particles; and while continuing to spin the base:
  ceasing exposure to the etchant; and
  applying a rinse solution to the base.

2. The method of claim 1 wherein the rinse solution and etchant are flowed sequentially through a nozzle directed at the spinning base.

3. The method of claim 1 wherein substantially all of the noble metal-containing particles are removed by the combination of the spinning, exposure to the etchant, and application of the rinse solution.

4. A method of removing noble metal-containing particles from over a base, comprising:

exposing the base and noble metal-containing particles to a composition that reduces adhesion between the noble metal-containing particles and the base;

while exposing to said composition, spinning the base to apply forces to the noble metal-containing particles and thereby sweep at least some of the noble metal-containing particles off from the base;

wherein the composition includes an etchant that etches the base and thereby undercuts the noble metal-containing particles; and wherein:
  the base comprises a photoresist surface and an oxide-containing surface;
  the noble metal-containing particles are adhered to both the photoresist surface and the oxide-containing surface; and
  the etchant comprises a mixture containing sulfuric acid and hydrogen peroxide.

5. The method of claim 4 wherein the oxide-containing surface consists of silicon dioxide.

6. A method of removing noble metal-containing particles from over two or more chemically different surfaces of a semiconductor wafer construction, comprising:

spinning the construction;

while spinning the construction, exposing the construction to a composition which reduces adhesion between the noble metal-containing particles and at least two of the chemically different surfaces;

wherein the composition alters surface properties of the noble metal-containing particles; and wherein the composition includes etchant suitable for etching said at least two of the chemically different surfaces.

7. A method of removing noble metal-containing particles from over two or more chemically different surfaces of a semiconductor wafer construction, comprising:

spinning the construction;

while spinning the construction, exposing the construction to a composition which reduces adhesion between the noble metal-containing particles and at least two of the chemically different surfaces; and wherein:
  one of said at least two of the surfaces comprises photoresist;
  another of said at least two of the surfaces comprises silicon dioxide; and
  the etchant comprises a mixture containing sulfuric acid and hydrogen peroxide.

8. The method of claim 7 wherein the noble metal-containing particles comprise one or more of palladium, platinum, rhodium, iridium and ruthenium.

\* \* \* \* \*

UNITED STATES PATENT AND TRADEMARK OFFICE
CERTIFICATE OF CORRECTION

PATENT NO.        : 8,507,387 B2
APPLICATION NO.   : 13/470911
DATED             : August 13, 2013
INVENTOR(S)       : Fatma Arzum Simsek-Ege et al.

It is certified that error appears in the above-identified patent and that said Letters Patent is hereby corrected as shown below:

On Title Page, Item (57), under "Abstract", column 2, line 15, delete "to is" and insert -- is --, therefor.

Signed and Sealed this
Fifth Day of November, 2013

Teresa Stanek Rea
*Deputy Director of the United States Patent and Trademark Office*